(12) United States Patent
Asao

(10) Patent No.: US 6,244,877 B1
(45) Date of Patent: Jun. 12, 2001

(54) ELECTRIC CONNECTION BOX AND MOLDED CONNECTION BLOCK FOR PRINTED CIRCUIT BOARD, AND METHOD OF MAKING SAME

(75) Inventor: Takahiro Asao, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/575,680

(22) Filed: Jun. 28, 2000

(30) Foreign Application Priority Data

Jul. 1, 1999 (JP) .................................. 11-187538

(51) Int. Cl.[7] .............................. H01R 12/00; H05K 1/00
(52) U.S. Cl. ..................... 439/76.2; 439/949; 361/760; 361/774
(58) Field of Search .................................. 439/76.2, 949, 439/620, 76.1; 361/760, 782, 783, 774

(56) References Cited

U.S. PATENT DOCUMENTS

| | | | |
|---|---|---|---|
| 3,500,295 | * | 3/1970 | Faber . |
| 4,857,002 | * | 8/1989 | Jensen ................................. 439/76.1 |
| 4,954,090 | * | 9/1990 | Shimochi ................................ 439/76 |

FOREIGN PATENT DOCUMENTS

| | | |
|---|---|---|
| 10178286 | 6/1998 | (JP) . |
| 10189170 | 7/1998 | (JP) . |

OTHER PUBLICATIONS

English Language Abstract of JP 10–178286.
English Language Abstract of JP 10–189170.

\* cited by examiner

*Primary Examiner*—Brian Sircus
*Assistant Examiner*—Javaid Nasri
(74) *Attorney, Agent, or Firm*—Greenblum & Bernstein, P.L.C.

(57) ABSTRACT

There is provided an electric connection box having excellent connection reliability and ease of assembly. The electric connection box is provided with a connector housing, a printed circuit board, and a connection block formed as a separate member from the connector housing and printed circuit board. The connection block is configured to hold the connection terminals by partially embedding a plurality of connection terminals in an insulator. The insulator is placed on the printed circuit board. Second ends of each of the connection terminal projecting from the insulator are soldered to conductors on the printed circuit board. First ends of each connection terminal are loosely inserted in throughholes in the connector housing to project into the connection housing.

15 Claims, 3 Drawing Sheets

US 6,244,877 B1

ELECTRIC CONNECTION BOX AND MOLDED CONNECTION BLOCK FOR PRINTED CIRCUIT BOARD, AND METHOD OF MAKING SAME

CROSS-REFERENCE TO RELATED APPLICATIONS

Not Applicable

STATEMENT REGARDING FEDERALLY SPONSORED RESEARCH

Not Applicable

REFERENCE TO A MICROFICHE APPENDIX

Not Applicable

BACKGROUND OF THE INVENTION

1. Description of Related Art

FIG. 4 shows a known electric connection box 41 to be mounted in an automobile and the like. This electric connection box 41 is equipped therein with a printed circuit board 42 having a function of ECU unit. On the top face of the printed circuit board 42 there are provided various electronic components which are not illustrated. The terminals of these electronic components are soldered to the metal plated through-hole or pad of the printed circuit board 42. On the top face side of the printed circuit board 42, a plurality of connector housings 43 formed of resin material are provided.

A terminal mounting part 44 is provided at the bottom of each connector housing 43, and a plurality of through-holes are provided in each terminal mounting part. A plurality of linear connection terminals 45 are press fit in the through-holes. The inner end of each connection terminal 45 projects into the connector housing 43. On the other hand, the outer end of each connection terminal 45 projects from the terminal mounting part 44, and is soldered to the metal plated through-hole of the printed circuit board 42.

There is also known an electric connection box 51 as shown in FIG. 5. In this electric connection box 51, each connection terminal 45 is bent at an angle of 90 degrees at an external part of the connector housing 43. As a result, the connector housing 43 is provided in horizontal a disposition on the printed circuit board 42. In this case, the connector housing 43 is attached to the printed circuit board 42 by screws.

Conventionally, however, because the connection terminals 45 are directly press fit to the connector housing 43, there has been a tendency to show displacement to the pitch between the connection terminals 45 due to thermal contraction of the connector housing 43 at the time of the molding. As a consequence of such displacement of pitch, stress is apt to be exerted to the soldered portion. Thus, it has not been possible to maintain high reliability of the connection on the related portion. Furthermore, in the event of displacement in pitch, it has been necessary to practice alignment work to adjust the position of each connection terminal 45, thus leading to a reduction in assembly efficiency.

2. Field of the Invention

The present invention relates to an electric connection box to be mounted, for example, on an automotive vehicle, and to a connection block to be used as a structure for connection in such electric connection box.

SUMMARY OF THE INVENTION

The present invention has been provided in view of the problems described above. An object is to provide an electric connection box having excellent connection reliability and ease of assembly.

In order to solve the above problems, an electric connection box includes a connector housing and a printed circuit board, and further includes a connection block holding a plurality of connection terminals partially embedded in an insulator. The printed circuit board and connector housing are provided with the connection blocks, which are formed as separate members, by placing an insulator on the printed circuit board, soldering a second end of each connection terminal projecting from the insulator to a conductor on a side of the printed circuit board, and allowing a first end of each connection terminal to project into the connector housing by loosely inserting it in a through-hole of the connector housing.

In another aspect of the present invention, an arm on which the second end depends is formed by bending, and a distance between the bent arm and the printed circuit board is set to be greater than the height of any electronic components to be mounted between the insulator and the second end.

In a further aspect of the present invention, the insulator is formed as a resin block, and the connection block is molded to hold the connection terminals by partially molding the connection terminals in the resin block.

In another aspect of the present invention, an electric connection box is provided that includes a case having at least one connector housing, a printed circuit board mountable within the case, and at least one separate connection block configured to be mounted on one face of the printed circuit board and to engage and support a lower surface of the connector housing. The connection block includes an insulator having at least one connection terminal partially embedded therein so that a first end of the at least one connection terminal extends from a first surface of the insulator and a second end of the at least one connection terminal extends from a second surface of the insulator, and wherein the first end of the at least one connection terminal extends through the lower surface of the connector housing and projects into an interior thereof, and the second end of the at least one connection terminal is connectable to the printed circuit board.

In other aspects of the present invention, the first surface of the insulator may be an upper surface and the second surface of the insulator may be a side surface, and a lower surface of the insulator may be directly mountable on the printed circuit board. Furthermore, a first portion of the second end of the at least one connection terminal may extend from the insulator generally at a right angle to the first end of the at least one connector portion, and a second portion of the second end may be formed to extend generally parallel to the first end at a position spaced from the insulator. Thus, the first end of the at least one connection terminal and the second portion of the second end are configured to permit flexing of the first end and the second portion and lateral movement of the insulator during installation of the at least one connection terminal into the lower surface of the connector housing to accommodate misalignment of parts.

In another aspect of the present invention, the first portion of the second end may be spaced a distance from the printed circuit board that is greater than a height of a component mounted on the printed circuit board between the insulator and the second portion of the second end. Also, the insulator of the connection block may be formed as a resin block, and the at least one connection terminal may be partially embedded in the resin block. Moreover, at least one through hole may be formed in the lower surface of the connector housing to receive the at least one connection terminal, the at least one through hole having a periphery greater than a periphery of the connection terminal such that the connection terminal is loosely received in the through hole.

In still another aspect of the present invention, a method of making an electric connection box is provided that includes providing an electric connection box including a case having at least one connector housing and a printed circuit board mountable within the case, providing at least one separate connection block configured to be mounted on one face of the printed circuit board and to engage and support a lower surface of the connector housing, the connection block including an insulator having at least one connection terminal partially embedded therein so that a first end of the at least one connection terminal extends from a first surface of the insulator and a second end of the at least one connection terminal extends from a second surface of the insulator, inserting the first end of the at least one connection terminal through the lower surface of the connector housing and into an interior thereof; and connecting the second end of the at least one connection terminal to the printed circuit board.

In a further aspect of the present invention, the first surface of the insulator may be an upper surface and the second surface of the insulator may be a side surface, and the method may further include mounting a lower surface of the insulator directly on the printed circuit board. Furthermore, a first portion of the second end of the at least one connection terminal may extend from the insulator generally at a right angle to the first end of the at least one connector portion, and a second portion of the second end may be formed to extend generally parallel to the first end at a position spaced from the insulator.

In another aspect of the present invention, the method may further include spacing the first portion of the second end a distance from the printed circuit board that is greater than a height of a component mounted on the printed circuit board between the insulator and the second portion of the second end.

In yet another aspect of the present invention, the method may further include forming the insulator of the connection block as a resin block, and partially embedding the at least one connection terminal in the resin block. Additionally, at least one through hole may be formed in the lower surface of the connector housing to receive the at least one connection terminal, the at least one through hole having a periphery greater than a periphery of the connection terminal such that the connection terminal is loosely received in the through hole.

Hereinafter, the operation of the present invention will be described.

According to the present invention, by loosely inserting the first end of each connection terminal into a through-hole of the connector housing to have the first end project into the housing, each connection terminal is less susceptible to the effects of the thermal shrinkage. The fact that the connection block is formed as a separate member from the printed circuit board and connector housing also contributes to alleviation of the effect of thermal shrinkage. Consequently, contrary to the conventional press-fit fixed structure, the present invention is less likely to exhibit displacement of pitch. Moreover, the construction of the connection terminals being mutually held by partially being embedded in an insulator also contributes to prevention of occurrence of displacement of pitch. As a result of the above, the effect of the thermal stress exerted on the soldered portion is alleviated, and alignment work for each connection terminal becomes unnecessary.

Additionally, due to the preservation of a space wherein the electronic components can be accommodated in positions underneath the bent arm, efficiency of mounting components on the printed circuit board is enhanced.

Moreover, because the connection terminals are mutually held by being partially molded in the resin block, generation of displacement of pitch is prevented. Consequently, the effect of the thermal stress exerted to the soldered portion is alleviated, and the alignment work for each connection terminal becomes unnecessary.

DESCRIPTION OF THE PREFERRED EMBODIMENTS

Detailed description follows of an electric connection box 1 for mounting in an automotive vehicle according to a first embodiment of the present invention.

Figure 1:
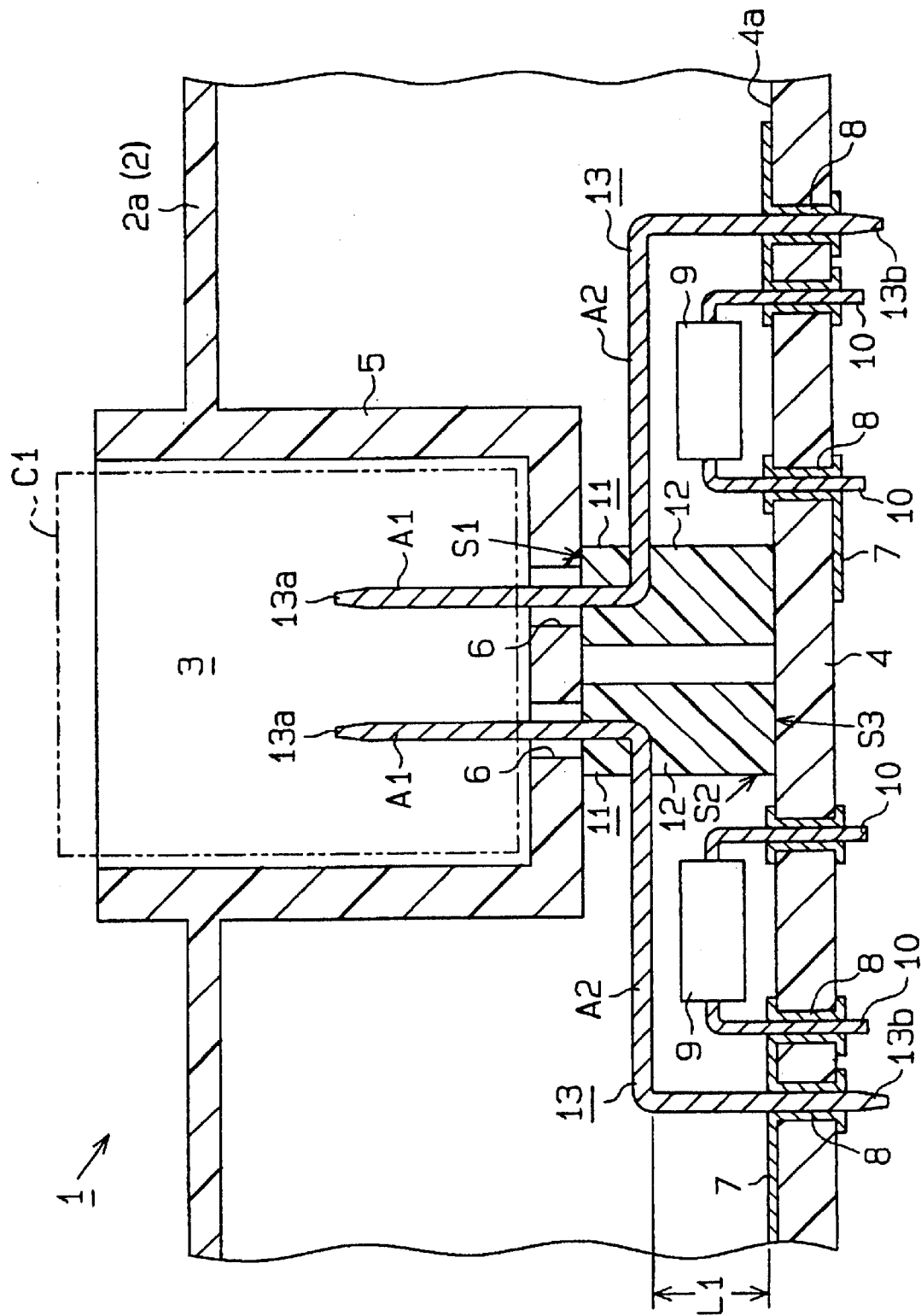
FIG. 1 is a cross-sectional view of an electric connection box according to one embodiment of the present invention.

As shown in FIG. 1, a resin case 2 forming the electric connection box 1 contains a printed circuit board 4 which functions as an ECU unit. The case 2 is formed of an upper case 2a and a lower case which is not illustrated. At predetermined positions at the top of the upper case 2a, any number of connector housings 5 may be formed (one being shown in FIG. 1) for fitting a female connector C1 into the inner space 3 thereof. The connector housing 5 has a generally box shape and is generally rectangular in cross-section, and the connector housing 5 projects inside the upper case 2a. At the bottom of the connector housing 5, there are arranged two rows of a plurality of through-holes 6 which may be formed in any suitable manner, for example, by slit-forming.

The printed circuit board 4 of the present embodiment is formed as a double-sided board having conductor patterns 7 on opposite sides of the substrate. The conductor patterns 7 provided on opposite side surfaces of the printed circuit board 4 mutually communicate through a plurality of metal plated through-holes 8 through which pin insertion is possible. In FIG. 1, on the component mounting face 4a (in the drawing, upper surface) of the printed circuit board 4, various electronic components (IC package, resistor, capacitor, etc.) 9 are mounted. These electronic components 9 each have a plurality of terminals 10 and each terminal 10 is inserted into a corresponding metal plated through-hole 8 and is soldered.

Between the printed circuit board 4 and the connector housing 5, a pair of connection blocks 11 are disposed as connecting structures to connect the two members electrically. That is to say, the two connection blocks 11 are disposed in rows at a position directly below the connector housing 5.

Figure 2:
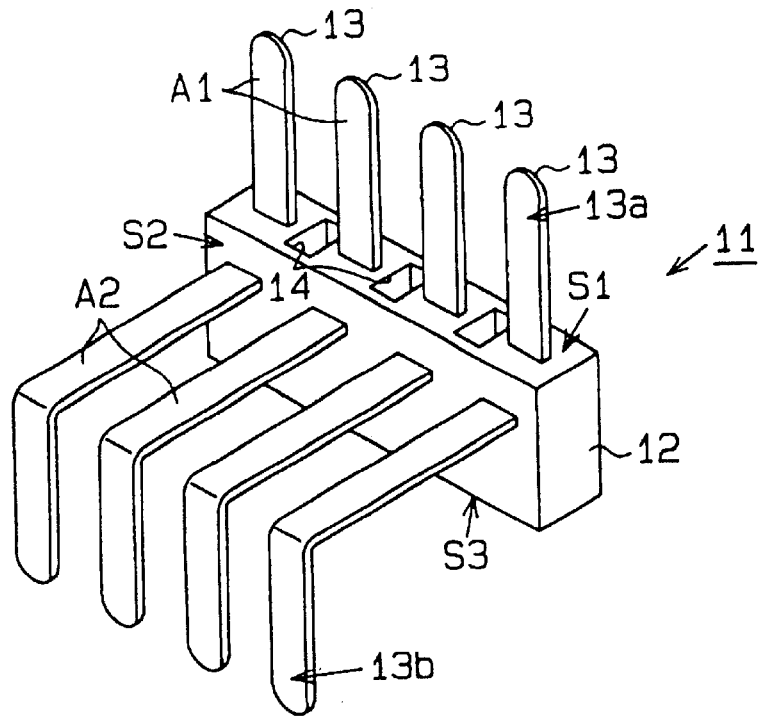
FIG. 2 is a perspective view of a connection block to be used in the electric connection box of the present invention.

As shown in FIG. 2, the connection block 11 of the present embodiment includes a plurality (four herein) of connection terminals 13 in a resin block 12. Accordingly, this connection block 11 is formed as a separate member from the printed circuit board 4 and the connector housing 5. An oblong rectangular parallelepiped shaped resin block 12 is manufactured by using a suitable resin molding material having insulating and heat resistance properties, for example, epoxy resin. As shown in FIG. 1, the lower face S3 of the resin block 12 is in direct contact with the component mounting face 4a of the printed circuit board 4.

The four connection terminals 13 are made of flat plate from electric conductive metal materials similar to that of general bus bars. These connection terminals 13 are held in parallel with, and at equal space from, one another by being molded in the resin block 12 by insert molding. An upper arm A1 of each connection terminal 13 is linearly formed, and projects vertically from the upper surface S1 of the resin block 12. On the other hand, the lower arm part A2 of each connection terminal 13 is formed by bending at a right angle, and projects from one side face S2 of the resin block 12. The second end 13b of the lower arm part A2 is bent downwardly to extend below the lower face of the resin block 12, and extends generally parallel to the upper arm part A1. This arrangement of the upper arm part A1 and the second end 13b permits some flexing of the upper arm part A1 and the second end 13b and lateral movement of the insulator block 12 during installation of the upper case to accommodate misalignment of the parts.

The distance L1 (FIG. 1) between the horizontal portion in the bent lower arm part A2 and the component mounting face 4a of the printed circuit board 4 is set to be greater than the height of the electronic component 9 to be mounted between the two members. In this embodiment, as shown in FIG. 1, a distance L1 of approximately 1.1–2.0 times the height of the electronic part 9 is provided.

In the region between the connection terminals 13 in the upper face S1 of the resin block 12 there are formed a plurality of misalignment prevention holes 14 (note FIG. 2). The misalignment prevention holes 14 are formed by mold elements during the molding process to prevent the flow of resin between adjacent connection terminals 13 to prevent misalignment of the connection terminals 13 during the molding process. Also, the misalignment prevention holes 14 may be formed as non-through holes, and may be of generally rectangular cross-section. In each connection terminal 13, the portion molded in the resin block 12 is bent at a right angle.

As shown in FIG. 1, the second end 13b of the lower arm A2 of each connection terminal 13 is inserted in the metal plated through-hole 8 on the printed circuit board 4 side and soldered. Namely, the second end A2 is inserted in a plated through-hole 8 from the same direction as that of the connection terminal 10 of other electronic components 9.

A bottom face S3 of the insulating block 12 is placed on the component mounting face 4a of the printed circuit board 4. However, the surfaces of the bottom face S3 and the component mounting face 4a are not bonded with an adhesive or the like. The second end 13b of the lower arm A2 is inserted in the plated through-hole 8 on the printed circuit board 4 and is soldered. On the other hand, the first end 13a of the upper arm A1 projects into the inner space 3 and is loosely inserted in the through-hole 6.

Assembly of the electric connection box 1 of the first embodiment is performed in the following manner.

First, a printed circuit board 4 is provided, and various electronic components 9 and connection blocks 11 are mounted together on the component mounting face 4a. In such a case, the respective terminals 10 and the second ends 13b of connection terminals 13 are inserted in the corresponding plated through-holes 8. Once the terminals 10 and 13 have been inserted, soldering is effected, and the respective terminals 10 and connection terminal 13 are joined to the plated through-hole 8 by the solder. The first end 13a of each connection terminal 13 in a pair of connection blocks 11 which has been soldered is thus positively positioned with respect to the through-holes 6.

Next, the printed circuit board 4 is mounted in a lower case (which is not illustrated), and an upper case 2a is engaged with the lower case. By this operation, the first end 13a of each connection terminal 13 can be easily and reliably loosely inserted into a respective through-hole 6. At this time, the bottom surface S3 of the resin block 12 is supported on the component mounting surface 4a of the printed circuit board 4. The electric connection box 1 shown in FIG. 1 is completed in the above manner.

Consequently, according to this embodiment, the following results can be obtained.

(1) In the electric connection box 1, the first end 13a of each connection terminal 13 projects into the inner space 3 under the condition that the first ends 13a are loosely inserted in the through-holes 6 of the connector housing 5. That is to say, a gap is present between the outer peripheral surface of the first ends 13a and the inner wall face of the through-holes 6 (as shown in FIG. 1), so that each connection terminal 13 is less susceptible to the effect of the thermal shrinkage of the connector housing 5. Also, the connection block 11 is formed as a separate member from the printed circuit board 4 and the connector housing 5. This construction also contributes to the alleviation of the effect of thermal shrinkage. Consequently, the electric connection box 1 of the first embodiment is, contrary to the conventional one which adopts the press-fit fixing structure, less likely to cause displacement of the pitches between the connection terminals 13. In addition, each connection terminal 13 is partially buried in the resin block 12 and is mutually held at an equal distance. This also contributes to prevention of the displacement of pitches.

As a result of the above, the effect of the thermal stress exerted on the soldered portion is alleviated, and individual alignment of each connection terminal 13 becomes unnecessary, so that it is possible to realize an electric connection box 1 having excellent connection reliability and ease of assembly.

(2) In the electric connection box 1 of the first embodiment, the distance L1 between the lower arm part A2 formed by bending and the component mounting face 4a of the printed circuit board 4 is set to be greater than the height of the electronic components 9 to be mounted between the two members. Accordingly, it is possible to provide a space for mounting the electronic component 9 in a position below the lower arm part A2.

Consequently, the component mounting efficiency in the printed circuit board 4 is elevated to result in improvement of the area utilization rate.

Figure 5:
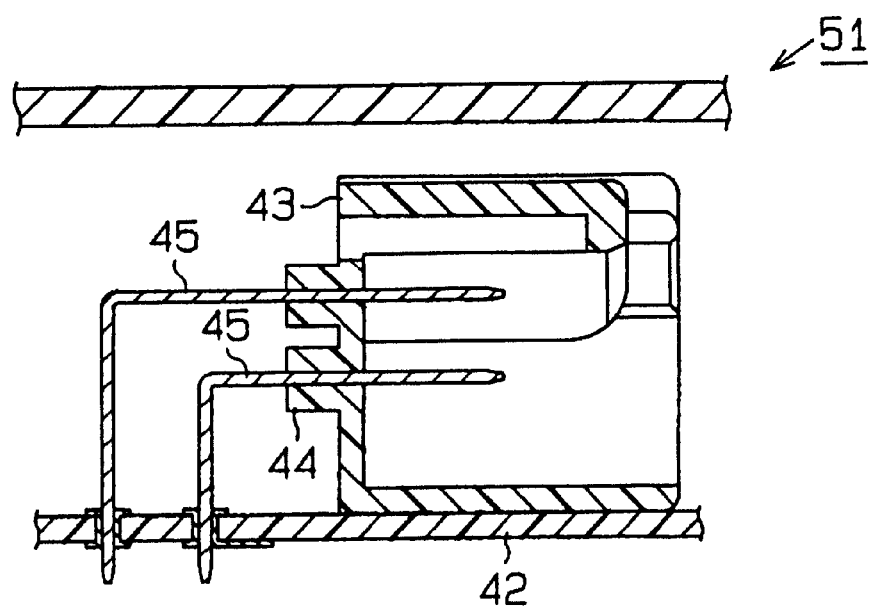
FIG. 5 is a schematic cross-sectional view showing a printed circuit board and a connector in another conventional electric connection box.

(3) The electric connection box 1 of the first embodiment is, contrary to that of the prior art shown in FIG. 5, not accompanied by a problem of reducing workability because it does not require screw fixing during assembly. Further, when viewed structurally, there is no degradation of the area utilization rate of printed circuit board 4.

(4) The connection structure to be used in the present embodiment is a connection block 11 having a structure which holds the connection terminals 13 together by molding four connection terminals 13 partially within a resin block 12. Accordingly, such a molded structure can be obtained simply and at a relatively low cost. Furthermore, a resin block 12 which constitutes a connection block 11 has favorable insulating and heat resistance properties. Accordingly, it can endure high temperature at the time of soldering, and yet it is possible to positively insulate the connection terminals 13 from one another at the time of use.

(5) In the electric connection box 1 of the first embodiment, a bottom face S3 of the resin block 12 is placed on a printed circuit board 4, and a bottom face of the connector housing 5 is placed on an upper face S1 of the resin block 12. Accordingly, it is possible to hold the connector housing 5 securely at a predetermined height. Also, it is possible to prevent warping of the upper case 2a at the time of mounting the connector C1.

The embodiment of the present invention may be modified in the following manner.

Figure 3:
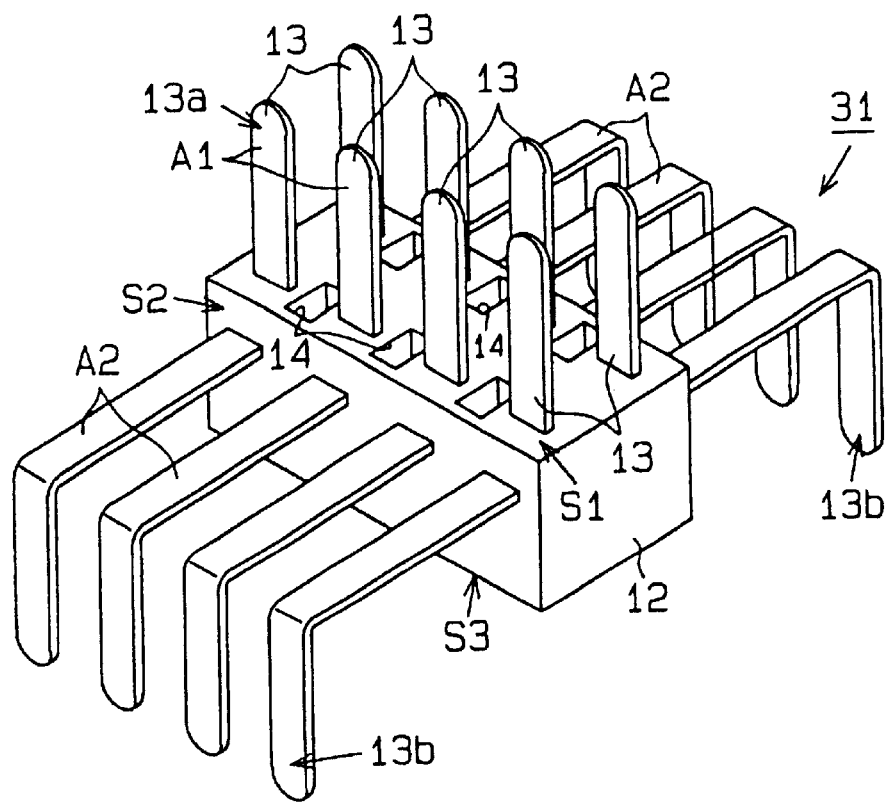
FIG. 3 is a perspective view of another embodiment of a connection block to be used in the electric connection box of the present invention.
Figure 4:
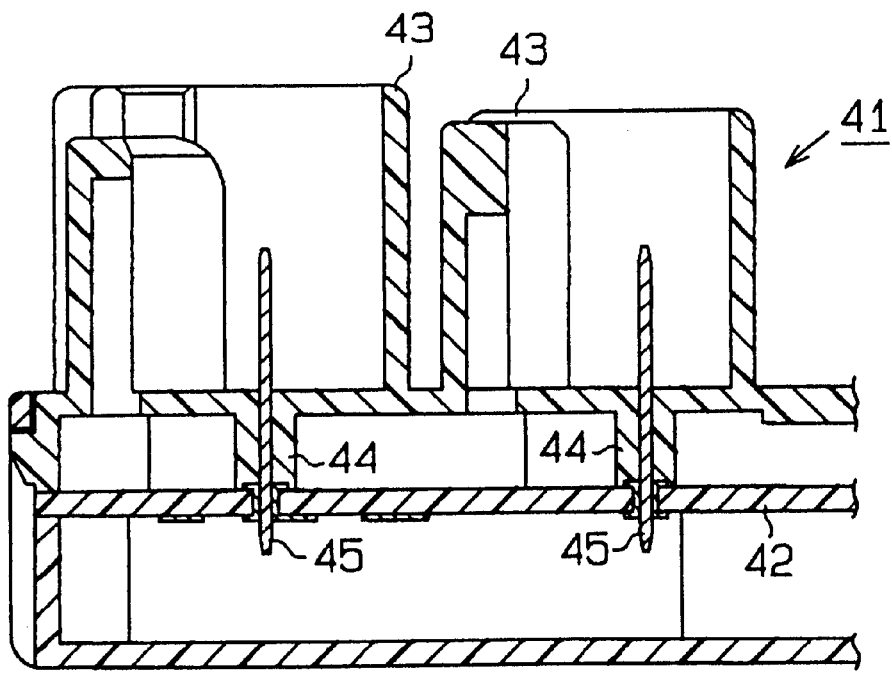
FIG. 4 is a schematic cross-sectional view showing a conventional electric box.

In one alternative, the pair of connection blocks 11 associated with a connector housing 5 (as shown in FIG. 1) may be formed as a single connection block 31, as shown in FIG. 3. This connection block 31 is made by molding, for example, eight connection terminals 13 in a resin block, with four terminals 13 on each side. The second end 13b of each connection terminal 13 on one side of connection block 31 projects from one side surface of the resin block 12, and the second end 13b of each connection terminal 13 on the other side of the block projects from the other side surface thereof. Accordingly, such a construction has the advantage that it requires the use of only one molded connection block 31 for each connection housing 5.

The insulators of the connection are not limited to the resin molded members obtainable by an insert molding process as in the first embodiment, but may be the resin formed members obtainable by molding methods other than the insert molding process or the resin formed members obtainable by a procedure other than a molding process. Of course, the materials having insulating and heat resistance properties are not necessarily limited to resin formed members but may be, for example, ceramic members and the like.

In order to project the first ends 13a into the connector housing 5, there may be provided an equal number of through-holes 6 to the number of connection terminals 13, as in the first embodiment. Alternatively, a single common through-hole 6 may be provided, through which the plurality of connection terminals 13 are inserted.

An upper arm part A1 to which the first end 13a belongs need not necessarily project from the upper face S1 of the resin block 12 but may project, for example, from any side surface of the resin block 12.

The resin block 12 need not have the shape of rectangular parallelepiped but, for example, may have a square post-shape or a cylindrical shape.

The shape, number, etc. of the slip prevention holes 14 in the resin block 12 are not limited to those of the first and second embodiments but may be optionally modified. The slip prevention hole 14 may also be omitted if not necessary.

The printed circuit board 4 is not limited to one having the function of ECU unit, but may be one having any other function.

The terminals 10 of the electronic components 9 and the connection terminals 13 of the connection blocks 11 need not be inserted into the plated through-holes 8 and soldered. For example, the printed circuit board 4 may be provided with a pad, to which a terminal 10 and a connection terminal 13 may be soldered in a surface packaging system.

The configuration of the connection terminals 13 molded in the resin block 12 need not be limited to the plate-shape form as in the disclosed embodiments but may be, for example, bar-like. Furthermore, the number of the connection terminals 13 molded in one resin block 12 may be increased or decreased.

In addition to the technical aspects described in claims, the technical aspects to be grasped by the foregoing embodiments are enumerated below, along with the effects thereof.

(1) The structure for connection is a molded connection block having a configuration that mutually holds the connection terminals by molding a plurality of connection terminals partially in a resin block. Thus, according to the invention described in the first technical aspect, a connection block can be obtained simply and at relatively low cost.

(2) In the first technical aspect a bottom face of the resin block is placed on the printed circuit board, and a bottom face of the connection housing is placed on the upper face of the resin block. Thus, according to the invention described in the second technical aspect, the connector housing can be securely held at a predetermined height, and warping of the case at the time of inserting the connector into the connector housing can be prevented.

(3) In the second technical aspect, a through-hole is provided at the bottom face of the connector housing, resulting in the third technical aspect.

(4) In any one of the technical aspects 1 through 3 above, the arm to which the second end belongs in each connection terminal projects only from one side surface of the resin block. Consequently, according to the invention described in the fourth technical aspect, in comparison with the case where the connection terminal projects from plural side surfaces, the arm is less likely to be affected by the thermal stress exerted at the time soldering, so that the reliability of connection of the soldered portion is improved.

Moreover, because the arm is formed to project not from the lower face of the resin block but from the side surface, sufficient heat radiation distance can be provided from the soldered portion.

(5) In the fourth technical aspect, in each connection terminal, the arm of the part to which the first end belongs projects vertically from the upper face of the resin block, resulting in the fifth technical aspect.

(6) In any one of the technical aspects 1 through 5 above, in the region positioned between the respective connection terminals a slip prevention hole is formed. Thus, according to the invention described in the sixth technical aspect, a formation of slip on the portion where the resin density is thick can be prevented.

As described above in detail, according to the present invention, an electric connection is box provided having excellent connection reliability and ease of assembly.

According to another aspect of the invention, component mounting efficiency on the printed circuit board can be improved.

Although the invention has been described herein with reference to particular means, materials and embodiments, the invention is not intended to be limited to the particulars disclosed herein; rather, the invention extends to all functionally equivalent structures, methods and uses, such as are within the scope of the appended claims.

The present disclosure relates to subject matter contained in priority Japanese Application No. HEI 11-187538, filed on Jul. 1, 1999, which is herein expressly incorporated by reference in its entirety.

DEPOSIT OF COMPUTER PROGRAM LISTINGS

Not Applicable

What is claimed is:

1. An electric connection box including a case having at least one connector housing, a printed circuit board mountable within the case, and at least one separate connection block configured to be mounted on one face of the printed circuit board and to engage and support a lower surface of the connector housing, said connection block comprising:

an insulator having at least one connection terminal including a first end of said at least one connection terminal that extends from a first surface of said insulator and a second end of said at least one connection terminal that extends from a second surface of said insulator, wherein said first surface of said insulator is an upper surface, and said second surface of said insulator is a side surface, and a lower surface of said insulator is directly mountable on the printed circuit board; and wherein said first end of said at least one connection terminal extends through the lower surface of the connector housing and projects into an interior thereof, and said second end of said at least one connection terminal is connectable to the printed circuit board.

2. The electric connection box according to claim 1, wherein a first portion of said second end of said at least one connection terminal extends from said insulator generally at a right angle to said first end of said at least one connection portion, and a second portion of said second end is formed to extend generally parallel to said first end at a position spaced from said insulator.

3. The electric connection box according to claim 2, wherein said first end of said at least one connection terminal and said second portion of said second end are configured to permit flexing of said first end and said second portion and lateral movement of said insulator during installation of said at least one connection terminal into the lower surface of the connector housing to accommodate misalignment of parts.

4. The electric connection box according to claim 2, wherein said first portion of said second end is spaced a distance from the printed circuit board that is greater than a height of a component mounted on the printed circuit board between said insulator and said second portion of said second end.

5. The electric connection box according to claim 4, wherein said insulator of said connection block is formed as a resin block, and said at least one connection terminal is partially embedded in said resin block.

6. The electric connection box according to claim 5, wherein said at least one connection terminal comprises a plurality of connection terminals.

7. The electric connection box according to claim 1, wherein said insulator further comprises at least a second connection terminal having a first end of said second connection terminal that extends from said first surface of said insulator, and a second end of said second terminal that extends from a third surface of said insulator.

8. The electric connection box according to claim 7, wherein said at least one connection terminal and at least a second connection terminal each comprise a plurality of connection terminals.

9. The electric connection box according to claim 1, wherein said insulator of said connection block is formed as a resin block, and said at least one connection terminal is partially embedded in said resin block.

10. The electric connection box according to claim 9, further comprising at least one through hole formed in the lower surface of the connector housing to receive said at least one connection terminal, said at least one through hole having a periphery greater than a periphery of said connection terminal such that said connection terminal is loosely received in said through hole.

11. A method of making an electric connection box, comprising:

providing an electric connection box including a case having at least one connector housing and a printed circuit board mountable within the case;

providing at least one separate connection block configured to be mounted on one face of the printed circuit board and to engage and support a lower surface of the connector housing, said connection block comprising an insulator having at least one connection terminal partially embedded therein so that a first end of said at least one connection terminal extends from a first surface of said insulator and a second end of said at least one connection terminal extends from a second surface of said insulator;

inserting said first end of said at least one connection terminal through the lower surface of the connector housing and into an interior thereof;

connecting said second end of said at least one connection terminal to the printed circuit board; and wherein said first surface of said insulator is an upper surface and said second surface of said insulator is a side surface; and said method further comprises:

mounting a lower surface of said insulator directly on the printed circuit board.

12. The method of making the electric connection box according to claim 11, wherein a first portion of said second end of said at least one connection terminal extends from said insulator generally at a right angle to said first end of said at least one connector portion, and a second portion of said second end is formed to extend generally parallel to said first end at a position spaced from said insulator, wherein said first end of said at least one connection terminal and said second portion of said second end are configured to permit flexing of said first end and said second portion and lateral movement of said insulator during installation of said at least one connection terminal into the lower surface of the connector housing to accommodate misalignment of parts.

13. The method of making the electric connection box according to claim 12, further comprising spacing said first portion of said second end a distance from the printed circuit board that is greater than a height of a component mounted on the printed circuit board between said insulator and said second portion of said second end.

14. The method of making the electric connection box according to claim 13, further comprising forming said insulator of said connection block as a resin block, and partially embedding said at least one connection terminal in said resin block.

15. The method of making the electric connection box according to claim 14, further comprising forming at least one through hole in the lower surface of the connector housing to receive said at least one connection terminal, said at least one through hole having a periphery greater than a periphery of said connection terminal such that said connection terminal is loosely received in said through hole.

* * * * *